(12) United States Patent
Bolt et al.

(10) Patent No.: US 9,804,196 B2
(45) Date of Patent: Oct. 31, 2017

(54) PROBES WITH FIDUCIAL MARKS, PROBE SYSTEMS INCLUDING THE SAME, AND ASSOCIATED METHODS

(71) Applicant: Cascade Microtech, Inc., Beaverton, OR (US)

(72) Inventors: Bryan Conrad Bolt, Beaverton, OR (US); Joseph George Frankel, Beaverton, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 61 days.

(21) Appl. No.: 14/997,371

(22) Filed: Jan. 15, 2016

(65) Prior Publication Data
US 2017/0205443 A1    Jul. 20, 2017

(51) Int. Cl.
*G01R 1/067* (2006.01)
*G01R 31/28* (2006.01)
(52) U.S. Cl.
CPC ..... *G01R 1/06794* (2013.01); *G01R 31/2891* (2013.01)
(58) Field of Classification Search
CPC .................. G01R 1/06794; G01R 31/2891
See application file for complete search history.

(56) References Cited

U.S. PATENT DOCUMENTS

| | | | |
|---|---|---|---|
| 6,710,798 B1 * | 3/2004 | Hershel | G01R 31/2887 324/750.23 |
| 6,924,653 B2 | 8/2005 | Schaeffer et al. | |
| 7,348,786 B2 | 3/2008 | Thacker et al. | |
| 7,355,422 B2 | 4/2008 | Walker | |
| 7,459,923 B2 | 12/2008 | Caldwell et al. | |
| 7,538,564 B2 | 5/2009 | Ehrmann et al. | |
| 7,634,128 B2 | 12/2009 | Snow et al. | |
| 8,531,202 B2 | 9/2013 | Mok et al. | |
| 2011/0089965 A1 * | 4/2011 | Endres | G01R 35/00 324/755.01 |
| 2014/0021970 A1 | 1/2014 | Endres et al. | |
| 2016/0161294 A1 * | 6/2016 | Ip | G01D 5/34 250/578.1 |

* cited by examiner

*Primary Examiner* — Jermele M Hollington
*Assistant Examiner* — Zannatul Ferdous
(74) *Attorney, Agent, or Firm* — Dascenzo Intellectual Property Law, P.C.

(57) ABSTRACT

Probes with fiducial marks, probe systems including the same, and associated methods. The probes include a beam portion and a probe tip that is configured to contact a device under test (DUT), and further include a fiducial mark formed on the beam portion that is configured to facilitate alignment of the probe and the DUT. The fiducial mark is configured to be visible to an optical assembly, and is in focus to the optical assembly within a depth of field of the optical assembly that is smaller than a depth of field over which the beam portion is in focus to the optical assembly. The methods include methods of utilizing and/or manufacturing the probes.

20 Claims, 4 Drawing Sheets

PROBES WITH FIDUCIAL MARKS, PROBE SYSTEMS INCLUDING THE SAME, AND ASSOCIATED METHODS

FIELD OF THE DISCLOSURE

The present disclosure relates generally to probes with fiducial marks, probe systems including the same, and associated methods.

BACKGROUND OF THE DISCLOSURE

Probe systems may be utilized to test the operation and/or performance of integrated circuit devices by contacting a contact pad of the integrated circuit device with a probe of the probe system. Integrated circuit devices may include contact pads that are on the order of tens of micrometers wide. As an example, current state-of-the art integrated circuit devices generally include contact pads that are 30-50 micrometers wide.

It follows then that aligning a probe with a contact pad requires very precise measurement and manipulation of the locations of the probe and/or the contact pad. This alignment process may be automated. Such an automated alignment process may include focusing an optical assembly, such as an optical microscope, on the contact pad and/or the probe to identify a relative position of the contact pad and/or the probe. However, identifying and/or focusing on the probe with the optical assembly may be difficult to reliably and consistently accomplish. Thus, there exists a need for probes that include features to facilitate focusing on the probe with an optical assembly in order to precisely identify a spatial location of the probe.

SUMMARY OF THE DISCLOSURE

Probes with fiducial marks, probe systems including the same, and associated methods are disclosed herein. The probes include a beam portion and a probe tip extending from the beam portion that is configured to contact a device under test (DUT). The probes further include a fiducial mark formed on the beam portion. The fiducial mark is configured to facilitate alignment of the probe and the DUT. The fiducial mark is configured to be visible to an optical assembly when the probe is brought into contact with the DUT, and more specifically when the probe is in focus to the optical assembly within a discrete depth of field of the optical assembly that is smaller than a depth of field over which the beam portion is in focus to the optical assembly.

The probe systems are configured to test a plurality of DUTs and include a plurality of probes that have a corresponding plurality of fiducial marks. The probe systems further include a chuck that defines a support surface that is configured to support a substrate that includes the plurality of DUTs, as well as an optical assembly that is configured to perform an optical measurement of at least a portion of the plurality of probes and/or of at least a portion of the substrate.

The associated methods include methods of aligning a probe with a DUT, which include utilizing a fiducial mark on a probe to facilitate alignment of the probe and the DUT. Specifically, such methods include contacting a surface of the DUT with a probe tip of the probe to create a scrub mark; at least substantially focusing the optical assembly on the scrub mark and on the fiducial mark to determine a relative position of the fiducial mark with respect to the scrub mark; and translating the probe tip with respect to the DUT to at least substantially align the probe tip and the DUT.

The associated methods additionally include methods of manufacturing a probe with a fiducial mark, which include providing a probe that has a beam portion and a probe tip, and forming a fiducial mark on the beam portion of the probe by adding material to the beam portion and/or removing material from the beam portion.

DETAILED DESCRIPTION AND BEST MODE OF THE DISCLOSURE

FIGS. 1-14 provide examples of probe systems 100 that include probes 110 with fiducial marks 116, of methods 200 of operating and/or utilizing the probe systems, and/or of methods 300 of manufacturing probes with fiducial marks. Elements that serve a similar, or at least substantially similar, purpose are labeled with like numbers in each of FIGS. 1-14, and these elements may not be discussed herein with reference to each of FIGS. 1-14. Similarly, all elements may not be labeled in each of FIGS. 1-14, but reference numerals associated therewith may be utilized herein for consistency. Elements, components, and/or features that are discussed herein with reference to one or more of FIGS. 1-14 may be included in and/or utilized with any of FIGS. 1-14 without departing from the scope of the present disclosure.

In general, elements that are likely to be included in a given (i.e., a particular) embodiment are illustrated in solid lines, while elements that are optional to a given embodiment are illustrated in dashed lines. However, elements that are shown in solid lines are not essential to all embodiments, and an element shown in solid lines may be omitted from a given embodiment without departing from the scope of the present disclosure.

Figure 1:
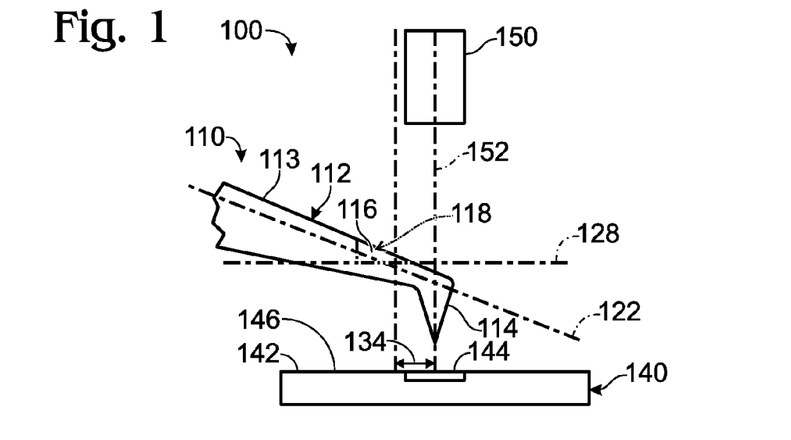
FIG. 1 is a schematic side view illustrating examples of a portion of a probe system according to the present disclosure.

FIG. 1 is a schematic side view of a portion of a probe system 100 that includes a probe 110 according to the present disclosure. Probe 110 includes a beam portion 112 and a probe tip 114 that extends from the beam portion and is configured to contact a device under test 140. As used herein, device under test 140 additionally or alternatively may be referred to as DUT 140. Probe 110 additionally includes a fiducial mark 116 that is formed on beam portion 112 and that is configured to facilitate alignment of probe 110 and a portion of DUT 140, such as a contact pad 144. Specifically, fiducial mark 116 is configured to be visible to an optical assembly 150 at least when probe 110 is aligned with and/or brought into contact with DUT 140.

Optical assembly 150 may be configured to receive an optical image along an optical axis 152 and may include, or be, a digital imaging device, a charge-coupled device, a camera, and/or an optical microscope. Optical assembly 150 may have a discrete depth of field such that focusing, or at least substantially focusing, the optical assembly on a portion of probe 110 may serve to precisely locate the portion of probe 110 in three dimensions. Stated differently, a spatial range over which an object (such as probe 110, or a portion thereof) may be in focus to optical assembly 150, as measured in a direction that is parallel, or at least substantially parallel, to optical axis 152 may be sufficiently narrow that focusing, or at least substantially focusing, the optical assembly on the object may provide a precise measurement of a distance between the optical assembly and the object, as measured in the direction that is at least substantially parallel to the optical axis.

Additionally, identifying a position of an object within a field of view of optical assembly 150 may provide a precise measurement of a location of the object as measured in a plane that is perpendicular, or at least substantially perpendicular, to optical axis 152. Thus, focusing optical assembly 150 on an object and identifying a location of the object within a field of view of the optical assembly may constitute an identification of a position of the object in three dimensions.

Figure 2:
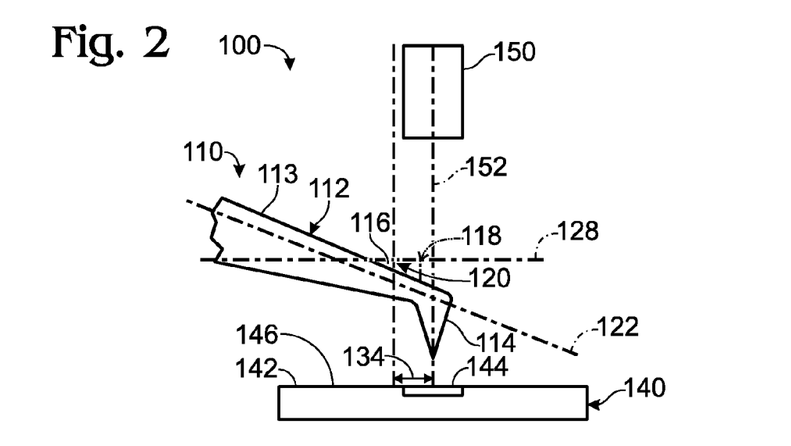
FIG. 2 is a schematic side view illustrating examples of a portion of a probe system according to the present disclosure.
Figure 3:
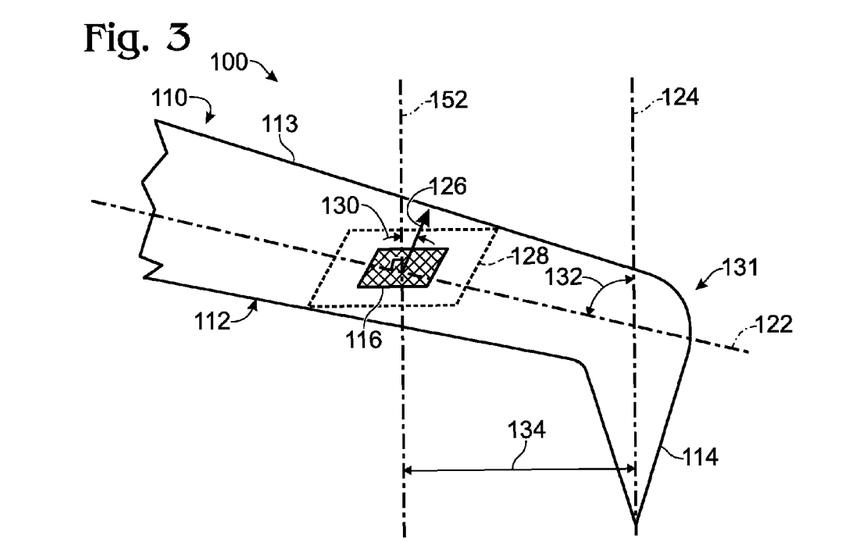
FIG. 3 is a schematic side view illustrating examples of a portion of a probe according to the present disclosure.

Fiducial mark 116 may be in focus to the optical assembly within a discrete depth of field of the optical assembly that is smaller than a depth of field over which beam portion 112 is in focus to the optical assembly. Stated differently, beam portion 112 may be configured and/or oriented such that optical assembly 150 cannot reliably focus, or at least substantially focus, on an entirety of a portion of a surface of the beam portion that does not include fiducial mark 116. For example, and as illustrated in FIGS. 1-3, beam portion 112 may have a longitudinal beam axis 122 that is not substantially perpendicular to optical axis 152 such that only a limited portion of a length of beam portion 112 may be in focus to optical assembly 150 at once. In such a configuration, the portion of beam portion 112 that is in focus to optical assembly 150 may have ill-defined boundaries and may lack a distinguishing feature, such that focusing on this portion of beam portion 112 cannot yield precise information regarding a position of beam portion 112. Therefore, fiducial mark 116 may be sized and/or shaped such that the optical assembly can reliably and precisely focus, or at least substantially focus, on the fiducial mark and thereby reproducibly locate the fiducial mark in three dimensions.

A precise identification of a location of fiducial mark 116 in three dimensions may allow for a subsequent precise alignment of the fiducial mark with a portion of DUT 140, such as contact pad 144. For example, sequentially focusing optical assembly 150 on fiducial mark 116 and on a feature on DUT 140 corresponding to a location of probe tip 114, such as a scrub mark 146 formed by probe tip 114, may provide a measurement of a spatial displacement between the fiducial mark and the probe tip. Thus, a subsequent measurement of a position of fiducial mark 116 by optical assembly 150 may provide information regarding the location of probe tip 112, such that the probe tip may be precisely aligned with and/or brought into contact with contact pad 144. Scrub mark 146 also may be referred to herein as a scratch mark 146 and/or as a probe mark 146.

Fiducial mark 116 may be configured to facilitate alignment of probe 110 and DUT 140 via an optical pattern recognition routine. The optical pattern recognition routine may be any suitable routine that may identify and/or locate fiducial mark 116 based, at least in part, on an optically measurable property of the fiducial mark. For example, fiducial mark 116 may optically contrast with a portion of a surface of beam portion 112 surrounding the fiducial mark.

As examples, fiducial mark 116 may include a region that is optically lighter than the portion of the surface of beam portion 112 surrounding the fiducial mark, and/or may include a region that is optically darker than the portion of the surface of the beam portion surrounding the fiducial mark. As additional examples, fiducial mark 116 may include a region that has a greater optical reflectivity than the portion of the surface of beam portion 112 surrounding the fiducial mark, and/or may include a region that has a lesser optical reflectivity than the portion of the surface of the beam portion surrounding the fiducial mark.

As still further examples, fiducial mark 116 may include a region that has a greater surface roughness than the portion of the surface of beam portion 112 surrounding the fiducial mark, and/or may include a region that has a lesser surface roughness than the portion of the surface of the beam portion surrounding the fiducial mark. As additional examples, fiducial mark 116 may include a region that scatters incident light to a greater extent than the portion of the surface of beam portion 112 surrounding the fiducial mark, and/or may include a region that scatters incident light to a lesser extent than the portion of the surface of the beam portion surrounding the fiducial mark.

As illustrated in FIG. 1, fiducial mark 116 may be defined by a recess 118 that extends from a surface of beam portion 112 and into the beam portion. As examples, fiducial mark 116 may include a laser-etched region of beam portion 112, a chemically-etched region of the beam portion, and/or a milled region of the beam portion. Additionally, when fiducial mark 116 includes the milled region of beam portion 112, the fiducial mark may include a substance, such as a paint, a dye, and/or an ink, that is deposited in the milled region of the beam portion. Additionally or alternatively, and as illustrated in FIG. 2, fiducial mark 116 may be defined by a projecting region 120 that extends from a surface of beam portion 112. As examples, fiducial mark 116 may include a substance, such as a paint, a dye, and/or an ink, that is applied to beam portion 112 to form projecting region 120. As further examples, fiducial mark 116 may include a projecting region 120 that is formed of a material such as a structural material of beam portion 112, and/or may further include a substance, such as a paint, a dye, and/or an ink, that is applied to projecting region 120.

Turning to FIG. 3, a configuration of beam portion 112 and probe tip 114 may be described with reference to longitudinal beam axis 122 and a longitudinal probe tip axis 124. For example, and while not required of all embodiments, longitudinal beam axis 122 and longitudinal probe tip axis 124 may intersect at a knee angle 132. Knee angle 132, when present, may be greater than 60 degrees, greater than 65 degrees, greater than 70 degrees, greater than 75 degrees, greater than 80 degrees, greater than 85 degrees, greater than 90 degrees, greater than 95 degrees, and/or greater than 100 degrees. Additionally or alternatively, knee angle 132 may be less than 140 degrees, less than 135 degrees, less than 130 degrees, less than 125 degrees, less than 120 degrees, less than 115 degrees, less than 110 degrees, less than 105 degrees, less than 100 degrees, less than 95 degrees, less than 90 degrees, less than 85 degrees, and/or less than 80 degrees. It is also within the scope of the present disclosure that probe tip 114 may extend from beam portion 112 along longitudinal beam axis 122. Under these conditions, probe 110 may be referred to herein as not including knee angle 132, longitudinal beam axis 122 may be referred to herein as being parallel to and/or collinear with longitudinal probe tip axis 124, and/or knee angle 132 may define an angle of, or of at least substantially, 0 degrees. Probe 110 may be a needle probe, and/or may form a portion of a probe card.

To facilitate alignment between probe tip 114 and DUT 140, it may be desirable to position fiducial mark 116 near probe tip 114. Such a configuration may facilitate a precise identification of a location of probe tip 114 based on a measurement of a position of fiducial mark 116. For example, fiducial mark 116 may be located at a mark position on beam portion 112 that is proximal the probe tip relative to an opposite end of the beam portion.

As illustrated in FIGS. 1-3, fiducial mark 116 may be described as being spaced apart from probe tip 114 by a mark offset 134 that is equal, or at least substantially equal, to a distance between a center point of fiducial mark 116 and a terminal end of probe tip 114, as measured in a direction that is parallel to a contacting surface 142 of DUT 140. In general, fiducial mark 116 may be located on probe 110 such that mark offset 134 is small. Stated another way, fiducial mark 116 may be located close to, or even partially coextensive with, a knee 131 of probe 110. Such a configuration may permit optical assembly 150 to simultaneously view both fiducial mark 134 and knee 131. Additionally or alternatively, the proximity of fiducial mark 116 to knee 131 may permit both the fiducial mark, or at least a portion of the fiducial mark, and the knee to remain within the field of view of the optical assembly despite thermal drift of the optical assembly with respect to the probe, such as may be caused by changing the temperature of the probe and/or of the DUT.

For example, beam portion 112 may be characterized by a beam length that is measured in a direction that is parallel to longitudinal beam axis 122. Mark offset 134 may be less than 0.5 times the beam length, less than 0.3 times the beam length, less than 0.25 times the beam length, less than 0.1 times the beam length, less than 0.05 times the beam length, and/or less than 0.01 times the beam length.

Figure 4:
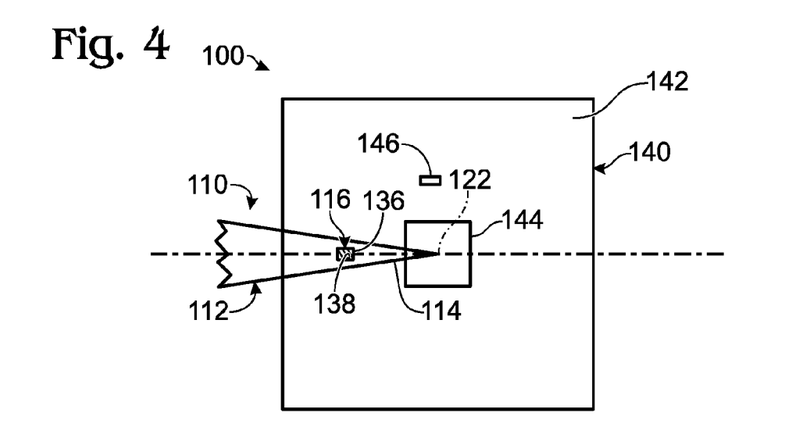
FIG. 4 is a schematic top view illustrating an example of a portion of a probe system according to the present disclosure.

Additionally or alternatively, beam portion 112 may be characterized by a beam width, or an average beam width, that is measured in a direction perpendicular to longitudinal beam axis 122. Mark offset 134 may be less than 10 times the beam width, less than 5 times the beam width, less than 3 times the beam width, less than 2 times the beam width, and/or less than the beam width. Additionally or alternatively, mark offset 134 may be less than 500 micrometers), less than 300 μm, less than 250 μm, less than 100 μm, less than 50 μm, less than 10 μm, and/or less than 5 μm. In some embodiments, beam portion 112 may not be rectangular and/or may not have a constant beam width. As examples, beam portion 112 may be tapered, as illustrated in FIG. 4, and/or may have a triangular, or truncated triangular, shape when viewed by optical assembly 150. Under these conditions, the beam width may include, or be, an average width of the beam portion.

With reference to FIGS. 1-2, it may be desirable to configure fiducial mark 116 such that optical assembly 150 may focus on an entirety, or at least a substantial entirety, of the fiducial mark even when optical assembly 150 is characterized by a depth of field that is small relative to an extent of an upper surface 113 of beam portion 112, as measured in a direction that is parallel to optical axis 152. Stated another way, fiducial mark 116 may be characterized as being defined in a fiducial plane 128 that is perpendicular, or at least substantially perpendicular, to optical axis 152. Specifically, and as illustrated in FIG. 3, fiducial plane 128 may be characterized by a fiducial normal vector 126 that is perpendicular, or at least substantially perpendicular, to the fiducial plane, such that the fiducial normal vector meets optical axis 152 at a tilt angle 130 that is less than 15 degrees, less than 10 degrees, less than 5 degrees, and/or less than 1 degree.

Fiducial plane 128 may be a portion of a surface of beam portion 112, or may be distinct from the surface of beam portion 112. For example, beam portion 112 may have a nonplanar upper surface 113, such that fiducial plane 128 is defined by a surface that is distinct from the nonplanar upper surface. Additionally or alternatively, fiducial plane 128 may be oriented such that an angle between a surface normal to fiducial plane 128 and optical axis 152 may be less than an angle between a surface normal to upper surface 113 and optical axis 152.

Such a configuration may facilitate more precise identification of a location of beam portion 112 in three dimensions at least because optical assembly 150 may more precisely focus on objects that are oriented in a plane that is perpendicular, or at least substantially perpendicular, to optical axis 152. That is, a focus range of optical assembly 150 may be characterized by a depth of field that defines a range of distances between an object and the optical assembly over which the object will be in focus to the optical assembly. Therefore, if an object is in focus to optical assembly 150 when the object is a given distance from optical assembly 150 (as measured along optical axis 152), then other objects that are the same distance from the optical assembly, or are within the depth of focus of the optical assembly, also will be in focus to the optical assembly. All points on fiducial plane 128, or at least within a portion of fiducial plane 128 that is within the field of view of optical assembly 150, may be equidistant from optical assembly 150 as measured along optical axis 152, may be at least substantially equidistant from optical assembly 150 as measured along optical axis 152, and/or may be within the depth of field of optical assembly 150. Thus, all such points simultaneously will be in focus to the optical assembly when any one of the points is in focus to the optical assembly.

As illustrated in FIGS. 4-10, fiducial mark 116 may have any appropriate shape, form, and/or configuration. To facilitate determining a location of fiducial mark 116 with respect to optical assembly 150, it may be desirable for fiducial mark 116 to include well-defined edges. For example, fiducial mark 116 may have a shape that includes an edge that is perpendicular, or at least substantially perpendicular, to longitudinal beam axis 122. Additionally or alternatively, and as illustrated in FIG. 4, fiducial mark 116 may have a shape that includes a first edge 136 and a second edge 138 that is perpendicular, or at least substantially perpendicular, to the first edge, such that the first edge and the second edge are each parallel, or at least substantially parallel, to fiducial plane 128 and/or such that the first edge 136 is parallel, or at least substantially parallel, to longitudinal beam axis 122 and second edge 138 is perpendicular, or at least substantially perpendicular, to the longitudinal beam axis.

Whereas focusing, or at least substantially focusing, optical assembly 150 on fiducial mark 116 may provide a measurement of a location of the fiducial mark as measured in a direction parallel to optical axis 152, a precise identification of a boundary of fiducial mark 116 is needed to identify a location of the fiducial mark in a plane perpendicular, or at least substantially perpendicular to the optical axis. Because a location of fiducial mark 116 may be identified utilizing a pattern recognition routine, which may depend on identifying edges of the fiducial mark, it may be beneficial to maximize the total edge perimeter of fiducial mark 116 relative to a given total size of the fiducial mark. Therefore, fiducial mark 116 may be characterized by a perimeter-to-area ratio that is defined as a total perimeter of the fiducial mark divided by an area of the fiducial mark that is optically distinct from a portion of beam portion 112 that does not include the fiducial mark. Specifically, fiducial mark 116 may have a perimeter-to-area ratio that is greater than that of a square that circumscribes a shape of the fiducial mark. Additionally or alternatively, optical assembly 150 may be configured to generate a pixelated image of fiducial mark 116, and an edge content to surface content ratio of the fiducial mark (i.e., a ratio of a number of pixels on an edge, or perimeter, of the fiducial mark when compared to a number of pixels on a surface of the fiducial mark) may be greater than that of the square that circumscribes the shape of the fiducial mark. For example, fiducial mark 116 may have a perimeter-to-area ratio and/or an edge content to surface content ratio that is at least 1.25 times greater, at least 1.5 times greater, at least 2 times greater, at least 3 times greater, and/or at least 5 times greater than that of the square that circumscribes the shape of the fiducial mark.

Figure 5:
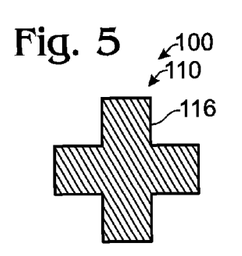
FIG. 5 is a schematic top view illustrating an example of a fiducial mark according to the present disclosure.
Figure 6:
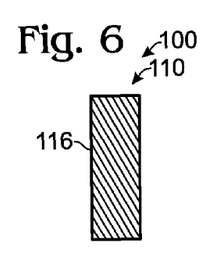
FIG. 6 is a schematic top view illustrating an example of a fiducial mark according to the present disclosure.
Figure 7:
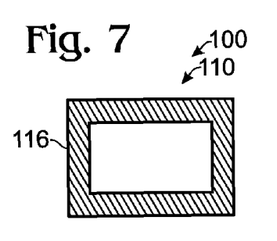
FIG. 7 is a schematic top view illustrating an example of a fiducial mark according to the present disclosure.
Figure 8:
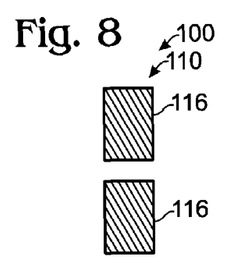
FIG. 8 is a schematic top view illustrating an example of a fiducial mark according to the present disclosure.
Figure 9:
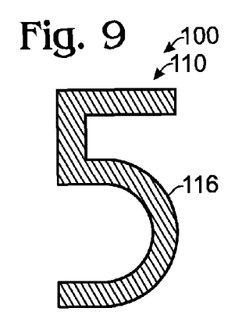
FIG. 9 is a schematic top view illustrating an example of a fiducial mark according to the present disclosure.
Figure 10:
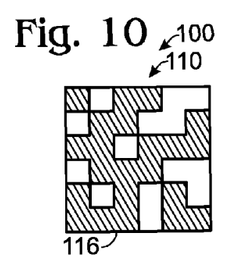
FIG. 10 is a schematic top view illustrating an example of a fiducial mark according to the present disclosure.

As illustrated in FIGS. 5-10, fiducial mark 116 may have a shape that includes a cross (as illustrated in FIG. 5), a polygon (as illustrated in FIGS. 5-6), a filled rectangle (as illustrated in FIG. 6), and/or an open rectangle (as illustrated in FIG. 7). Fiducial mark 116 also may have a shape that includes a numeral (as illustrated in FIG. 9), an alphabetic letter, a barcode, and/or a matrix (two-dimensional) barcode (as illustrated in FIG. 10). Additionally or alternatively, fiducial mark 116 may have a shape that includes at least two disconnected mark elements, such as is illustrated in FIG. 8.

Figure 11:
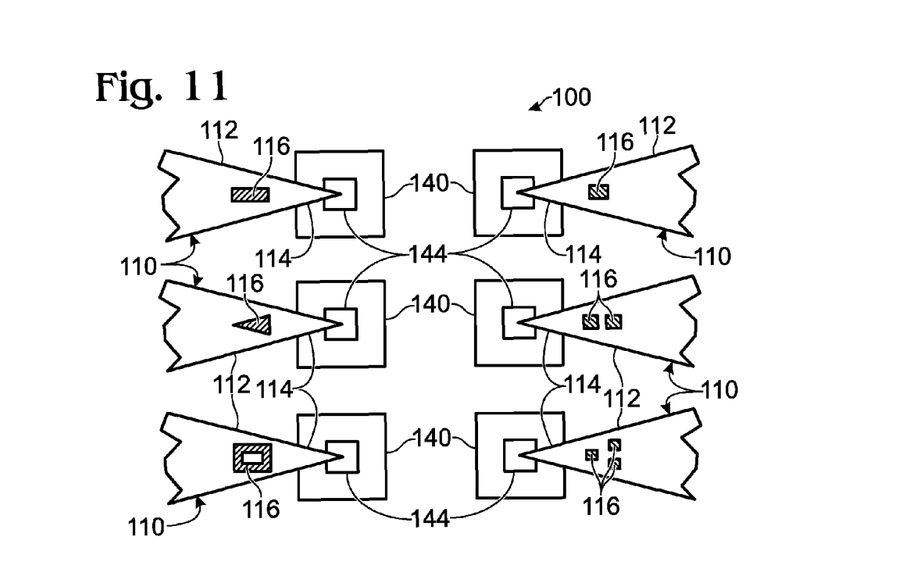
FIG. 11 is a schematic top view illustrating an example of a portion of a probe system according to the present disclosure.
Figure 12:
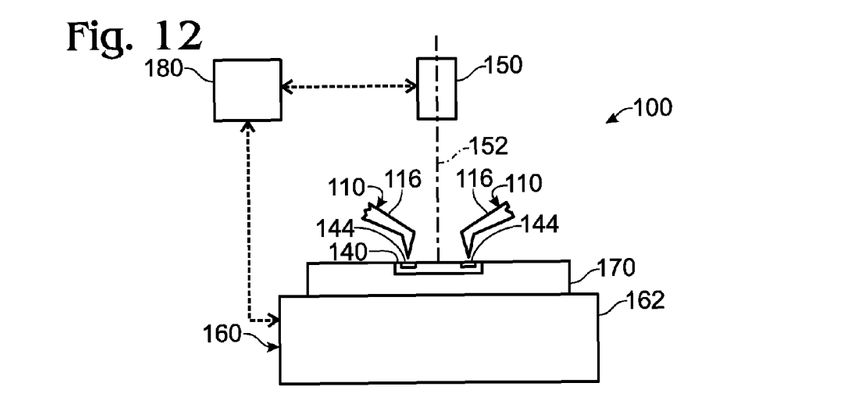
FIG. 12 is a schematic representation of an example of a probe system according to the present disclosure.

With reference to FIGS. 11-12, probes 110 according to the present disclosure may be utilized in conjunction with a probe system 100 that includes a plurality of probes 110 that include a corresponding plurality of fiducial marks 116. In such a configuration, it may be desirable to uniquely identify a given probe 110 via a measurement by optical assembly 150 simultaneously, or at least substantially simultaneously, with identifying a location of fiducial mark 116 of the given probe. For example, and as illustrated in FIG. 11, probe system 100 may include a plurality of probes 110 with a corresponding plurality of fiducial marks 116, and each fiducial mark 116 may be distinct from at least one other fiducial mark 116. Additionally or alternatively, each fiducial mark 116 may be distinct from each, or every, other fiducial mark 116.

Each fiducial mark 116 of the plurality of fiducial marks 116 may be a unique identifier that uniquely identifies the probe 110 that includes the fiducial mark. For example, each fiducial mark 116 may include, or be, a unique numeral of a sequence of numerals. Additionally or alternatively, each fiducial mark 116 may include a unique barcode, such as a matrix barcode. Additionally or alternatively, each fiducial mark 116 may include a plurality of geometric shapes such that the number of geometric shapes included in the fiducial mark may be unique to the corresponding probe 110. Such a configuration may facilitate a unique identification of each probe 110 utilizing optical assembly 150 such that an identification of the probe and a measurement of a spatial location of corresponding fiducial mark 116 may occur simultaneously, or at least substantially simultaneously.

With reference to FIG. 12, probe system 100 further may include a chuck 160 that defines a support surface 162 configured to support a substrate 170 that includes a plurality of DUTs 140. Probe system 100 also may include a controller 180. Controller 180 may be configured to control the operation of, or to automate, probe system 100. As an example, controller 180 may be configured to execute some or all of the methods 200, which are described herein. Additionally or alternatively, controller 180 may be configured to control any suitable component of probe system 100, such as probe 110, optical assembly 150, and/or chuck 160.

Figure 13:
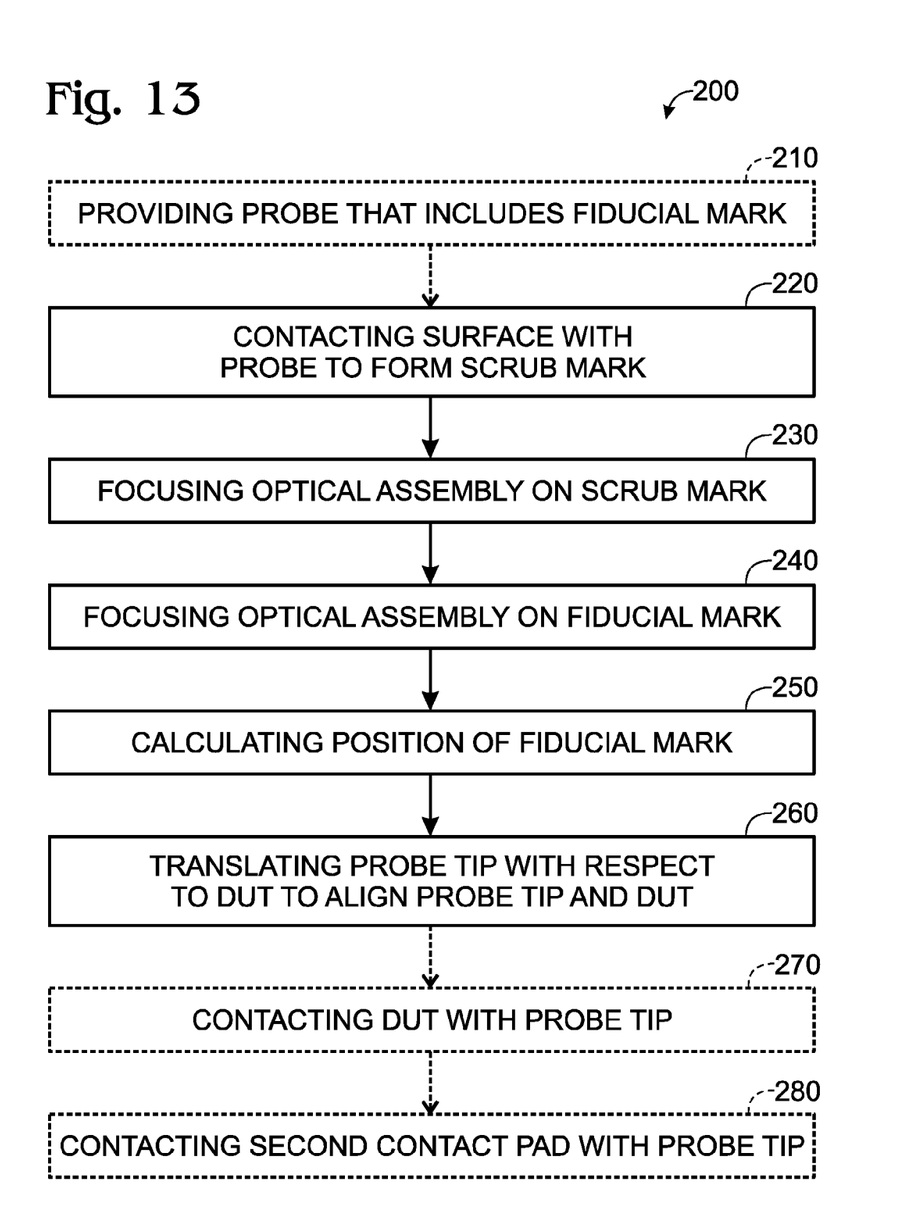
FIG. 13 is a flowchart depicting methods, according to the present disclosure, of aligning a probe and a device under test.

FIG. 13 is a flowchart depicting methods 200, according to the present disclosure, of aligning a probe that includes a fiducial mark with a DUT. These methods also may be referred to herein as methods of calibrating the probe and/or as methods of calibrating a spatial relationship between the fiducial mark and a probe tip of the probe.

Methods 200 may include providing a probe that includes a fiducial mark at 210, and include contacting a surface with a probe tip of the probe to form a scrub mark on the surface at 220, focusing an optical assembly on the scrub mark at 230, focusing the optical assembly on the fiducial mark at 240, calculating a position of the fiducial mark at 250, and translating the probe with respect to a DUT to align the probe and the DUT at 260. Methods 200 additionally may include contacting a contact pad of the DUT with the probe tip at 270 and/or contacting a second contact pad of the DUT with the probe tip at 280.

The providing at 210 may include providing a probe (such as probe 110 of FIGS. 1-4 and 11-12) that is configured to contact a DUT (such as DUT 140 of FIGS. 1-2, 4, and 11-12). The probe includes a fiducial mark (such as fiducial mark 116 of FIGS. 1-12). This may include obtaining, purchasing, and/or manufacturing the probe. Additionally or alternatively, this also may include utilizing a probe that forms a portion of a probe system (such as probe system 100 of FIGS. 1-12) to perform methods 200.

The contacting at 220 may include contacting a surface with a probe tip (such as probe tip 114 of FIGS. 1-4 and 11) to create a scrub mark (such as scrub mark 146 of FIGS. 1-2 and 4) that is visible to an optical assembly (such as optical assembly 150 of FIGS. 1-2 and 12). The contacting at 220 may include bringing the probe tip into contact with the surface. Additionally or alternatively, the contacting at 220 may include bringing the probe tip into contact with the surface and subsequently translating the probe tip with respect to the surface while maintaining contact between the probe tip and the surface and/or while overdriving the probe tip toward the surface, such as to form the scrub mark on the surface. Additionally or alternatively, the contacting at 220 may include separating the probe tip from the surface subsequent to forming the scrub mark.

The surface may include and/or be any suitable surface. As examples, the surface may include and/or be a reference surface, a reference substrate, and/or a calibration substrate. As another example, the surface may include and/or be a portion of the DUT that is different than a portion of the DUT with which the probe tip is configured to be aligned, such as during the translating at 260. As yet another example, the surface may include and/or be the contact pad of the DUT.

The focusing at 230 may include focusing, or at least substantially focusing, on the scrub mark with the optical assembly, which may yield information regarding a position of the scrub mark in three dimensions. Similarly, the focusing at 240 includes focusing, or at least substantially focusing, on the fiducial mark with the optical assembly, which may yield information regarding a position of the fiducial mark in three dimensions.

The calculating at 250 may include calculating a position of the fiducial mark with respect to the scrub mark and is based, at least in part, on the focusing at 230 and on the focusing at 240. The calculating at 250 may include calculating a difference in position between the fiducial mark and the scrub mark. As an example, the calculating at 250 may include calculating three mutually orthogonal components of the difference independently. As another example, the calculating at 250 may include calculating an absolute distance between the fiducial mark and the scrub mark and/or a displacement direction from the fiducial mark to the scrub mark.

As yet another example, the calculating at 250 may include calculating a distance between the fiducial mark and the scrub mark as measured in a direction that is parallel, or at least substantially parallel, to a contacting surface of the DUT (such as contacting surface 142 of FIGS. 1-2 and 4). Additionally or alternatively, the calculating at 250 may include determining a displacement between the fiducial mark and the probe tip. For example, when the contacting at 220 includes separating the probe tip from the DUT subsequent to forming the scrub mark (which may be desirable to ensure that the scrub mark is within a field of view of the optical assembly), the separating may include translating the probe tip with respect to the DUT by a known displacement. Thus, a calculation of a difference in position between the fiducial mark and the scrub mark, together with the known displacement of the probe tip with respect to the scrub mark, may be utilized to determine a spatial separation between the fiducial mark and the probe tip.

The translating at 260 may include translating the probe tip with respect to the DUT to align, or at least substantially align, the probe tip and the DUT and/or with a contact pad of the DUT (such as contact pad 144 of FIGS. 1-2, 4, and 11-12). The translating at 260 may be based, at least in part, on the calculating at 250. For example, the spatial separation between the fiducial mark and the probe tip (as determined in the calculating at 250) subsequently may be utilized to determine a displacement between the probe tip and the contact pad based, at least in part, on a calculated displacement between the fiducial mark and the contact pad. Stated differently, the contact pad may be shaped and/or configured such that focusing, or at least substantially focusing, the optical assembly on the contact pad may yield information regarding a position of the contact pad in three dimensions. This in turn may allow for a calculation of a displacement between the fiducial mark and the contact pad, which, together with the determined spatial separation between the fiducial mark and the probe tip, may be utilized to determine a displacement between the probe tip and the contact pad.

The translating at 260 may include independently translating the probe and/or the DUT. The translating at 260 may be initiated while the probe tip is in contact with the DUT following the contacting at 220, or may be initiated while the probe tip is not in contact with the DUT following the contacting at 220.

The contacting at 270 may include translating the probe tip with respect to the DUT to bring the probe tip into physical and/or electrical contact with a portion of the DUT such as the contact pad, such as to enable the probe to perform an electrical measurement of the DUT. The contacting at 270 may include independently translating the probe and/or the DUT in a direction that is perpendicular, or at least substantially perpendicular, to the contacting surface of the DUT. The contacting at 270 may include translating the probe and/or the DUT by a distance that is substantially equal to a distance separating the probe tip and the contact pad following the translating at 260, and/or may include overdriving the probe tip into the DUT by continuing to translate the probe and/or the DUT toward one another after physical and/or electrical contact is established.

The contacting at 280 may include contacting a second contact pad of the DUT subsequent to the translating at 260 and/or the contacting at 270. That is, in a configuration in which the DUT has a plurality of contact pads, it may be desirable to utilize the positional relationship between the probe tip and the fiducial mark as calculated at 250 to align the probe tip with more than one of the contact pads without repeating the contacting at 220, the focusing at 230, the focusing at 240, and/or the calculating at 250.

Additionally or alternatively, the second contact pad may be on, or may form a portion of, another, or a second, DUT. Under these conditions, the positional relationship between the probe tip and the fiducial mark, as calculated at 250, may be utilized to align the probe tip with the second contact pad of the second DUT and may be performed without repeating the contacting at 220, the focusing at 230, the focusing at 240, and/or the calculating at 250.

The contacting at 280 may be based, at least in part, on focusing, or at least substantially focusing, the optical assembly on the second contact pad and focusing, or at least substantially focusing, the optical assembly on the fiducial mark of the probe. The contacting at 280 further may include calculating a difference in location between the probe tip (prior to initiating the translating) and the second contact pad via the known positional relationship between the probe tip and the fiducial mark.

In some embodiments of probes 100 that are disclosed herein, a manufacturing process for probes 100 may be such that the spatial relationship between the fiducial mark and the probe tip is known. Additionally or alternatively, the spatial relationship between the fiducial mark and the probe tip may be predetermined, such as by viewing the probe with a suitable microscope and/or by performing a calibration that includes the contacting at 220, the focusing at 230, the focusing at 240, and/or the calculating at 250.

Under these conditions, it is within the scope of the present disclosure that methods 200 may include performing the translating at 260, performing the contacting at 270, and/or performing the contacting at 280 without first performing the contacting at 220, the focusing at 230, the focusing at 240, and/or the calculating at 250. As an example, and when the spatial relationship between the fiducial mark and the probe tip is known and/or predetermined, the translating at 260 may include translating to align, or at least substantially align, the probe tip with the DUT based, at least in part, on the known and/or predetermined spatial relationship between the fiducial mark and the probe tip. This may include focusing the optical assembly on the fiducial mark, focusing the optical assembly on the contact pad of the DUT, and calculating the displacement between the probe tip and the contact pad based upon the known and/or predetermined spatial relationship between the fiducial mark and the probe tip.

Figure 14:
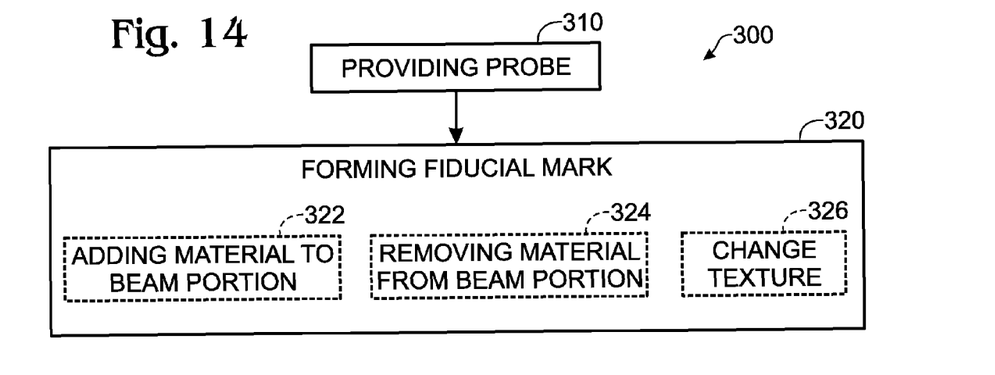
FIG. 14 is a flowchart depicting methods, according to the present disclosure, of manufacturing a probe with a fiducial mark.

FIG. 14 is a flowchart depicting methods 300, according to the present disclosure, of manufacturing a probe with a fiducial mark. Methods 300 include providing a probe at 310 and forming a fiducial mark at 320.

The providing a probe at 310 may include providing a probe that includes a beam portion (such as beam portion 112 of FIGS. 1-4 and 11) and a probe tip (such as probe tip 114 of FIGS. 1-4 and 11). The providing at 310 may include obtaining, purchasing, and/or manufacturing the probe. Additionally or alternatively, the providing at 310 also may include utilizing a probe that forms a portion of a probe system (such as probe system 100 of FIGS. 1-12) to perform methods 300.

The forming at 320 may include adding material to the beam portion at 322, removing material from the beam portion at 324, and/or changing a surface texture of the beam portion at 326. The adding material at 322 may include forming a projecting region (such as projecting region 120 of FIG. 2) that extends from a surface of the beam portion. This may include adding a paint, a dye, and/or an ink to the beam portion. Additionally or alternatively, the adding material at 322 may include forming the projecting region from a material such as a structural material of the beam portion and may further include subsequently adding a paint, a dye, and/or an ink to the projecting region.

The removing material at 324 may include forming a recess (such as recess 118 of FIG. 1) that extends from the surface of the beam portion and into the beam portion. This may include etching a region of the beam portion with a laser, chemically etching a region of the beam portion, and/or milling a region of the beam portion.

The changing the surface texture at 326 may include modifying any suitable property of a portion of the surface of the beam portion. As examples, the changing at 326 may include changing a roughness of the portion of the surface of the beam portion, changing an optical reflectivity of the portion of the surface of the beam portion, and/or changing an optical absorption property of the portion of the surface of the beam portion. The changing at 326 may be accomplished in any suitable manner. As examples, the changing at 326 may include heating the portion of the surface of the beam portion, etching the portion of the surface of the beam portion, and/or laser etching the portion of the surface of the beam portion.

It is within the scope of the present disclosure that the forming at 320 may include both the adding at 322 and the removing at 324. For example, the forming at 320 may include removing material from the beam portion at 324 to form the recess and subsequently adding material to the beam portion at 322 by applying a paint to the recess.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B"") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

Illustrative, non-exclusive examples of probes, probe systems, and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A probe for a probe system, the probe comprising:
a beam portion;
a probe tip extending from the beam portion and configured to contact a device under test (DUT); and
a fiducial mark formed on the beam portion and configured to facilitate alignment of the probe and the DUT, wherein the fiducial mark:
  (i) is configured to be visible to an optical assembly when the probe is brought into contact with the DUT; and
  (ii) is in focus to the optical assembly within a discrete depth of field of the optical assembly that is smaller than a depth of field over which the beam portion is in focus to the optical assembly.

A2. The probe of paragraph A1, wherein the fiducial mark is configured to facilitate alignment of the probe and the DUT via an optical pattern recognition routine.

A3. The probe of any of paragraphs A1-A2, wherein the fiducial mark optically contrasts with a portion of a surface of the beam portion surrounding the fiducial mark.

A4. The probe of any of paragraphs A1-A3, wherein the fiducial mark is optically lighter than a/the portion of a/the surface of the beam portion surrounding the fiducial mark.

A5. The probe of any of paragraphs A1-A4, wherein the fiducial mark is optically darker than a/the portion of a/the surface of the beam portion surrounding the fiducial mark.

A6. The probe of any of paragraphs A1-A5, wherein the fiducial mark has a greater optical reflectivity than a/the portion of a/the surface of the beam portion surrounding the fiducial mark.

A7. The probe of any of paragraphs A1-A6, wherein the fiducial mark has a lesser optical reflectivity than a/the portion of a/the surface of the beam portion surrounding the fiducial mark.

A8. The probe of any of paragraphs A1-A7, wherein the fiducial mark has a greater surface roughness than a/the portion of a/the surface of the beam portion surrounding the fiducial mark.

A9. The probe of any of paragraphs A1-A8, wherein the fiducial mark has a lesser surface roughness than a/the portion of a/the surface of the beam portion surrounding the fiducial mark.

A10. The probe of any of paragraphs A1-A9, wherein the fiducial mark scatters incident light to a greater extent than a/the portion of a/the surface of the beam portion surrounding the fiducial mark.

A11. The probe of any of paragraphs A1-A10, wherein the fiducial mark scatters incident light to a lesser extent than a/the portion of a/the surface of the beam portion surrounding the fiducial mark.

A12. The probe of any of paragraphs A1-A11, wherein the fiducial mark is defined by a recess that extends from a/the surface of the beam portion and into the beam portion.

A13. The probe of paragraph A12, wherein the fiducial mark includes a laser-etched region of the beam portion.

A14. The probe of any of paragraphs A12-A13, wherein the fiducial mark includes a chemically-etched region of the beam portion.

A15. The probe of any of paragraphs A12-A14, wherein the fiducial mark includes a milled region of the beam portion.

A16. The probe of paragraph A15, wherein the fiducial mark includes a substance that is deposited in the milled region of the beam portion.

A17. The probe of paragraph A16, wherein the substance includes at least one of a paint, a dye, and an ink.

A18. The probe of any of paragraphs A1-A11, wherein the fiducial mark is defined by a projecting region that extends from a/the surface of the beam portion.

A19. The probe of paragraph A18, wherein the fiducial mark includes a substance that is applied to the beam portion.

A20. The probe of paragraph A19, wherein the substance includes at least one of a paint, a dye, and an ink.

A21. The probe of any of paragraphs A1-A20, wherein the fiducial mark is located at a mark position on the beam portion that is proximal the probe tip relative to an opposite end of the beam portion.

A22. The probe of any of paragraphs A1-A21, wherein the fiducial mark is spaced apart from the probe tip by a mark offset that is equal, or at least substantially equal, to a distance between a center point of the fiducial mark and a terminal end of the probe tip as measured in a direction that is parallel to a contacting surface of the DUT.

A23. The probe of paragraph A22, wherein the beam portion has a beam length, and further wherein the mark offset is less than 0.5 times the beam length, less than 0.3 times the beam length, less than 0.25 times the beam length, less than 0.1 times the beam length, less than 0.05 times the beam length, and/or less than 0.01 times the beam length.

A24. The probe of any of paragraphs A22-A23, wherein the beam portion has a beam width, and further wherein the mark offset is less than 10 times the beam width, less than 5 times the beam width, less than 3 times the beam width, less than 2 times the beam width, and/or less than the beam width.

A25. The probe of any of paragraphs A22-A24, wherein the mark offset is less than 500 micrometers (m), less than 300 µm, less than 250 µm, less than 100 µm, less than 50 µm, less than 10 µm, and/or less than 5 µm.

A26. The probe of any of paragraphs A1-A25, wherein the optical assembly is configured to collect an image along an optical axis, and further wherein the fiducial mark is defined in a fiducial plane that is perpendicular, or at least substantially perpendicular, to the optical axis.

A27. The probe of paragraph A26, wherein the fiducial plane is perpendicular to a fiducial normal vector, and further wherein the fiducial normal vector intersects the optical axis at an angle that is less than 15 degrees, less than 10 degrees, less than 5 degrees, and/or less than 1 degree.

A28. The probe of any of paragraphs A1-A27, wherein a side of the beam portion that includes the fiducial mark has a nonplanar upper surface, and further wherein the fiducial mark is defined in a/the fiducial plane that is distinct from the nonplanar upper surface.

A29. The probe of any of paragraphs A1-A28, wherein the fiducial mark has a shape that includes an edge that is perpendicular, or at least substantially perpendicular, to a longitudinal axis of the beam.

A30. The probe of any of paragraphs A1-A29, wherein the fiducial mark has a shape that includes a first edge and a second edge that is perpendicular, or at least substantially perpendicular, to the first edge, wherein the first edge and the second edge are parallel, or at least substantially parallel, to a/the fiducial plane.

A31. The probe of any of paragraphs A1-A30, wherein the fiducial mark has a shape that has a perimeter-to-area ratio, or an edge content to surface content ratio, that is greater than that of a square that circumscribes the shape of the fiducial mark.

A32. The probe of paragraph A31, wherein the perimeter-to-area ratio, or the edge content to surface content ratio, of the shape is at least 1.25 times greater, at least 1.5 times greater, at least 2 times greater, at least 3 times greater, and/or at least 5 times greater than that of the square that circumscribes the shape of the fiducial mark.

A33. The probe of any of paragraphs A1-A32, wherein the fiducial mark has a shape that includes at least one of:
(i) a cross;
(ii) a polygon;
(iii) a filled rectangle; and
(iv) an open rectangle.

A34. The probe of any of paragraphs A1-A33, wherein the fiducial mark has a shape that includes at least two disconnected mark elements.

A35. The probe of any of paragraphs A1-A34, wherein the fiducial mark includes a numeral.

A36. The probe of any of paragraphs A1-A35, wherein the fiducial mark includes an alphabetic letter.

A37. The probe of any of paragraphs A1-A36, wherein the fiducial mark includes a barcode.

A38. The probe of paragraph A37, wherein the barcode is a matrix barcode.

A39. The probe of any of paragraphs A1-A38, wherein the probe tip has a longitudinal probe tip axis, and wherein the beam portion has a longitudinal beam axis.

A40. The probe of paragraph A39, wherein the longitudinal probe tip axis of the probe tip and the longitudinal beam axis intersect at a knee angle.

A41. The probe of paragraph A40, wherein the knee angle is greater than 60 degrees, greater than 65 degrees, greater than 70 degrees, greater than 75 degrees, greater than 80 degrees, greater than 85 degrees, greater than 90 degrees, greater than 95 degrees, and/or greater than 100 degrees.

A42. The probe of any of paragraphs A40-A41, wherein the knee angle is less than 140 degrees, less than 135 degrees, less than 130 degrees, less than 125 degrees, less than 120 degrees, less than 115 degrees, less than 110 degrees, less than 105 degrees, less than 100 degrees, less than 95 degrees, less than 90 degrees, less than 85 degrees, and/or less than 80 degrees.

A43. The probe of any of paragraphs A1-A42, wherein the probe is a needle probe.

A44. The probe of any of paragraphs A1-A43, wherein the probe forms a portion of a probe card.

B1. A method of aligning a probe with a device under test (DUT), the method comprising:
optionally providing a probe that has a probe tip and a beam portion that includes a fiducial mark;
contacting a surface of the DUT with the probe tip to create a scrub mark on the surface of the DUT;
focusing, or at least substantially focusing, an optical assembly on the scrub mark;
focusing, or at least substantially focusing, the optical assembly on the fiducial mark;
calculating a position of the fiducial mark with respect to the DUT, wherein the calculating is based, at least in part, on the focusing, or at least substantially focusing, on the scrub mark and the focusing, or at least substantially focusing, on the fiducial mark; and
translating the probe tip with respect to the DUT to align, or at least substantially align, the probe tip and the DUT, wherein the translating is based, at least in part, on the calculating.

B2. The method of paragraph B1, wherein the probe is the probe of any of paragraphs A1-A44.

C1. A probe system configured to test a plurality of devices under test (DUTs), the probe system comprising:
a plurality of probes with a corresponding plurality of fiducial marks, wherein each probe of the plurality of probes is the probe of any of paragraphs A1-A44.

C2. The probe system of paragraph C1, wherein the probe system further comprises:
a chuck that defines a support surface configured to support a substrate that includes the plurality of DUTs;
an optical assembly configured to perform an optical measurement of at least a portion of the plurality of probes and/or at least a portion of the substrate; and
a controller programmed to execute the method of any of paragraphs B1-B2.

C3. The probe system of any of paragraphs C1-C2, wherein each fiducial mark of the plurality of fiducial marks is distinct from each other fiducial mark of the plurality of fiducial marks.

C4. The probe of any of paragraphs C1-C3, wherein at least one fiducial mark of the plurality of fiducial marks is distinct from at least one other fiducial mark of the plurality of fiducial marks.

C5. The probe of any of paragraphs C1-C4, wherein each fiducial mark of the plurality of fiducial marks includes a unique identifier that uniquely identifies the probe that includes the fiducial mark.

C6. The probe of paragraph C5, wherein the unique identifier includes a numeral of a sequence of numerals.

C7. The probe of any of paragraphs C5-C6, wherein the unique identifier includes a barcode.

C8. The probe of paragraph C7, wherein the barcode is a matrix barcode.

C9. The probe of any of paragraphs C5-C8, wherein the unique identifier includes a plurality of geometrical shapes, wherein a number of shapes in the plurality of geometrical shapes is unique to the corresponding probe.

D1. A method of manufacturing a probe with a fiducial mark, the method comprising:

providing a probe that has a beam portion and a probe tip; and forming a fiducial mark on the beam portion, wherein the forming includes at least one of adding material to the beam portion, removing material from the beam portion, and changing a surface texture of a portion of a surface of the beam portion.

D2. The method of paragraph D1, wherein the adding material to the beam portion includes forming a projecting region that extends from a surface of the beam portion.

D3. The method of paragraph D2, wherein the adding material to the beam portion includes adding at least one of a paint, a dye, and an ink to the beam portion.

D4. The method of any of paragraphs D1-D3, wherein the removing material from the beam portion includes forming a recess that extends from a/the surface of the beam portion and into the beam portion.

D5. The method of paragraph D4, wherein the removing material from the beam portion includes etching a region of the beam portion with a laser.

D6. The method of any of paragraphs D4-D5, wherein the removing material from the beam portion includes chemically etching a/the region of the beam portion.

D7. The method of any of paragraphs D4-D6, wherein the removing material from the beam portion includes milling a/the region of the beam portion.

D8. The method of any of paragraphs D1-D7, wherein the changing the surface texture of the portion of the surface of the beam portion includes at least one of changing a roughness of the portion of the surface of the beam portion, changing an optical reflectivity of the portion of the surface of the beam portion, and/or changing an optical absorption property of the portion of the surface of the beam portion.

E1. A method of aligning a probe with a device under test (DUT), the method comprising:

receiving a predetermined spatial relationship between a fiducial mark of the probe and a probe tip of the probe;

focusing, or at least substantially focusing, an optical assembly on the fiducial mark;

focusing, or at least substantially focusing, the optical assembly on a contact pad of the DUT; and translating the probe tip with respect to the DUT to align, or at least substantially align, the probe tip with the contact pad of the DUT, wherein the translating is based, at least in part, on the predetermined spatial relationship between the fiducial mark and the probe tip.

E2. The method of paragraph E1, wherein the focusing the optical assembly on the fiducial mark may include determining a position of the fiducial mark in three dimensions, wherein the focusing the optical assembly on the contact pad may include determining a position of the contact pad in three dimensions, and further wherein the translating further is based, at least in part, on the position of the fiducial mark in three dimensions and on the position of the contact pad in three dimensions.

E3. The method of any of paragraphs E1-E2, wherein the probe includes the probe of any of paragraphs A1-A44.

INDUSTRIAL APPLICABILITY

The probes, probe systems, and methods disclosed herein are applicable to the semiconductor test industry.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, when the disclosure, the preceding numbered paragraphs, or subsequently filed claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe for a probe system, the probe comprising:
a beam portion;
a probe tip extending from the beam portion and configured to contact a device under test (DUT); and
a fiducial mark formed on the beam portion and configured to facilitate alignment of the probe and the DUT, wherein the fiducial mark:
(i) is configured to be visible to an optical assembly when the probe is brought into contact with the DUT; and
(ii) is in focus to the optical assembly within a discrete depth of field of the optical assembly that is smaller than a depth of field over which the beam portion is in focus to the optical assembly.

2. The probe of claim 1, wherein the fiducial mark optically contrasts with a portion of a surface of the beam portion surrounding the fiducial mark.

3. The probe of claim 1, wherein the fiducial mark is at least one of optically lighter and optically darker than a portion of a surface of the beam portion surrounding the fiducial mark.

4. The probe of claim 1, wherein the fiducial mark includes a laser-etched region of the beam portion.

5. The probe of claim 1, wherein the fiducial mark is located at a mark position on the beam portion that is proximal the probe tip relative to an opposite end of the beam portion.

6. The probe of claim 5, wherein the fiducial mark is spaced apart from the probe tip by a mark offset that is at least substantially equal to a distance between the fiducial mark and the probe tip as measured in a direction that is parallel to a contacting surface of the DUT, wherein the beam portion has a beam length, and further wherein the mark offset is less than 0.1 times the beam length.

7. The probe of claim 5, wherein the fiducial mark is spaced apart from the probe tip by a mark offset that is at least substantially equal to a distance between the fiducial mark and the probe tip as measured in a direction that is parallel to a contacting surface of the DUT, and further wherein the mark offset is less than 500 micrometers.

8. The probe of claim 1, wherein the optical assembly is configured to collect an image along an optical axis, and further wherein the fiducial mark is defined in a fiducial plane that is at least substantially perpendicular to the optical axis.

9. The probe of claim 8, wherein the fiducial plane is perpendicular to a fiducial normal vector, and further wherein the fiducial normal vector intersects the optical axis at an angle that is less than 10 degrees.

10. The probe of claim 1, wherein the fiducial mark has a shape that includes an edge that is at least substantially perpendicular to a longitudinal axis of the beam portion.

11. The probe of claim 1, wherein the fiducial mark has a shape that includes a first edge and a second edge that is at least substantially perpendicular to the first edge, wherein the first edge and the second edge are at least substantially parallel to a fiducial plane that is at least substantially perpendicular to the optical axis.

12. The probe of claim 1, wherein the fiducial mark has a shape that has an edge content to surface content ratio that is greater than that of a square that circumscribes the shape.

13. The probe of claim 12, wherein the edge content to surface content ratio of the shape is at least 1.25 times greater than that of the square that circumscribes the shape.

14. The probe of claim 1, wherein the fiducial mark has a shape that includes at least one of:
    a cross;
    (ii) a polygon;
    (iii) a filled rectangle;
    (iv) an open rectangle;
    (v) at least two disconnected mark elements;
    (vi) a numeral;
    (vii) an alphabetic letter; and
    (viii) a barcode.

15. The probe of claim 1, wherein the probe forms a portion of a probe card.

16. A probe system configured to test a plurality of devices under test (DUTs), the probe system comprising:
    a plurality of probes with a corresponding plurality of fiducial marks, wherein each probe of the plurality of probes includes the probe of claim 1;
    a chuck that defines a support surface configured to support a substrate that includes the plurality of DUTs; and
    an optical assembly configured to perform an optical measurement of at least a portion of the plurality of probes and/or of at least a portion of the substrate.

17. The probe system of claim 16, wherein each fiducial mark of the plurality of fiducial marks is distinct from at least one other fiducial mark of the plurality of fiducial marks, and further wherein each fiducial mark of the plurality of fiducial marks includes a unique identifier that uniquely identifies the probe that includes the fiducial mark.

18. A method of aligning a probe with a device under test (DUT), the method comprising:
    contacting a surface of the DUT with a probe tip of a probe to create a scrub mark on the surface of the DUT, wherein the probe includes a fiducial mark;
    at least substantially focusing an optical assembly on the scrub mark;
    at least substantially focusing the optical assembly on the fiducial mark;
    calculating a position of the fiducial mark with respect to the DUT, wherein the calculating is based, at least in part, on the at least substantially focusing on the scrub mark and the at least substantially focusing on the fiducial mark; and
    translating the probe tip with respect to the DUT to at least substantially align the probe tip and the DUT, wherein the translating is based, at least in part, on the calculating.

19. A method of manufacturing a probe with a fiducial mark, the method comprising:
    providing a probe that has a beam portion and a probe tip; and
    forming a fiducial mark on the beam portion, wherein the forming includes at least one of adding material to the beam portion and removing material from the beam portion.

20. The method of claim 19, wherein the forming includes removing material from the beam portion, and further wherein the removing material from the beam portion includes etching a region of the beam portion with a laser.

* * * * *

UNITED STATES PATENT AND TRADEMARK OFFICE
CERTIFICATE OF CORRECTION

| | | |
|---|---|---|
| PATENT NO. | : 9,804,196 B2 | |
| APPLICATION NO. | : 14/997371 | |
| DATED | : October 31, 2017 | |
| INVENTOR(S) | : Bryan Conrad Bolt and Joseph George Frankel | |

It is certified that error appears in the above-identified patent and that said Letters Patent is hereby corrected as shown below:

In the Claims

Column 19, Line 29, please insert --(i)-- before "a cross;".

Signed and Sealed this
Fifth Day of December, 2017

Joseph Matal
*Performing the Functions and Duties of the
Under Secretary of Commerce for Intellectual Property and
Director of the United States Patent and Trademark Office*